US009412651B2

(12) United States Patent
Tsai et al.

(10) Patent No.: US 9,412,651 B2
(45) Date of Patent: Aug. 9, 2016

(54) AIR-GAP FORMATION IN INTERCONNECT STRUCTURES

(71) Applicant: Taiwan Semiconductor Manufacturing Company, Ltd., Hsin-Chu (TW)

(72) Inventors: Cheng-Hsiung Tsai, Zhunan Township (TW); Chung-Ju Lee, Hsin-Chu (TW); Tien-I Bao, Dayuan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/456,524

(22) Filed: Aug. 11, 2014

(65) Prior Publication Data
US 2014/0349481 A1 Nov. 27, 2014

Related U.S. Application Data

(62) Division of application No. 13/691,499, filed on Nov. 30, 2012, now Pat. No. 8,866,297.

(51) Int. Cl.
*H01L 23/522* (2006.01)
*H01L 21/768* (2006.01)
*H01L 21/3213* (2006.01)
*H01L 23/532* (2006.01)

(52) U.S. Cl.
CPC ........ *H01L 21/7682* (2013.01); *H01L 21/3213* (2013.01); *H01L 21/76831* (2013.01); *H01L 21/76834* (2013.01); *H01L 21/76885* (2013.01); *H01L 23/522* (2013.01); *H01L 23/5222* (2013.01); *H01L 23/53238* (2013.01); *H01L 23/53295* (2013.01); *H01L 23/53223* (2013.01); *H01L 23/53266* (2013.01); *H01L 2924/0002* (2013.01)

(58) Field of Classification Search
CPC ............ H01L 21/7682; H01L 21/3213; H01L 21/76831; H01L 23/5222
USPC .................. 257/774, 762, E21.581, E23.144, 257/E23.152, E21.158; 438/639, 421, 595, 438/619, 667
See application file for complete search history.

(56) References Cited

U.S. PATENT DOCUMENTS

| 4,926,237 | A | * | 5/1990 | Sun et al. ....................... 257/764 |
| 5,679,982 | A | * | 10/1997 | Gardner ......................... 257/758 |
| 5,880,018 | A | * | 3/1999 | Boeck ............... H01L 21/76807 257/E21.579 |
| 6,228,763 | B1 | | 5/2001 | Lee |
| 6,501,180 | B1 | | 12/2002 | Kitch |
| 2006/0030128 | A1 | * | 2/2006 | Bu et al. ........................ 438/462 |
| 2006/0189137 | A1 | * | 8/2006 | Anderson et al. ............. 438/691 |
| 2010/0001409 | A1 | | 1/2010 | Humbert |
| 2010/0015813 | A1 | | 1/2010 | McGinnis et al. |
| 2011/0183516 | A1 | | 7/2011 | Lee |
| 2014/0217520 | A1 | * | 8/2014 | Niebojewski ..... H01L 21/28114 257/412 |

OTHER PUBLICATIONS

"Ultraviolet Radiation, What is it?", 2001. Biospherical Instruments Inc. p. 1.*
Pantouvaki, M., et al., "Air-gap formation by UV-assisted decomposition of CVD material," Microelectronic Engineering, vol. 85, Issue 10, Oct. 2008, 3 pages.

* cited by examiner

*Primary Examiner* — Mohammad Islam
*Assistant Examiner* — Christina Sylvia
(74) *Attorney, Agent, or Firm* — Slater Matsil, LLP

(57) ABSTRACT

A structure includes a substrate, and a first metal line and a second metal line over the substrate, with a space therebetween. A first air gap is on a sidewall of the first metal line and in the space, wherein an edge of the first metal line is exposed to the first air gap. A second air gap is on a sidewall of the second metal line and in the space, wherein an edge of the second metal line is exposed to the second air gap. A dielectric material is disposed in the space and between the first and the second air gaps.

19 Claims, 10 Drawing Sheets

AIR-GAP FORMATION IN INTERCONNECT STRUCTURES

PRIORITY CLAIM AND CROSS-REFERENCE

This application is a divisional of U.S. patent application Ser. No. 13/691,499, entitled "Air-Gap Formation in Interconnect Structures," filed on Nov. 30, 2012, which application is incorporated herein by reference.

BACKGROUND

As the semiconductor industry introduces new generations of integrated circuits (ICs) having higher performance and greater functionality, the density of the elements that form the ICs is increased, while the dimensions and spacing between components or elements of the ICs are reduced. In the past, such reductions were limited only by the ability to define the structures photo-lithographically, device geometries having smaller dimensions created new limiting factors. For example, for any two adjacent conductive features, when the distance between the conductive features decreases, the resulting capacitance (a function of the dielectric constant (k value) of the insulating material divided by the distance between the conductive features) increases. The increased capacitance results in an increased capacitive coupling between the conductors, increased power consumption, and an increase in the resistive-capacitive (RC) time constant. Therefore, the continual improvement in semiconductor IC performance and functionality is dependent upon developing materials with low k values.

Since the substance with the lowest dielectric constant is air (k=1.0), low-k dielectric materials typically comprise porous materials. Also, air-gaps are formed to further reduce the effective k value of interconnect structures.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An interconnect structure that comprises air gaps therein and the method of forming the same are provided in accordance with various exemplary embodiments. The intermediate stages of forming the interconnect structure are illustrated. The variations of the embodiments are discussed. Throughout the various views and illustrative embodiments, like reference numbers are used to designate like elements.

Figure 1:
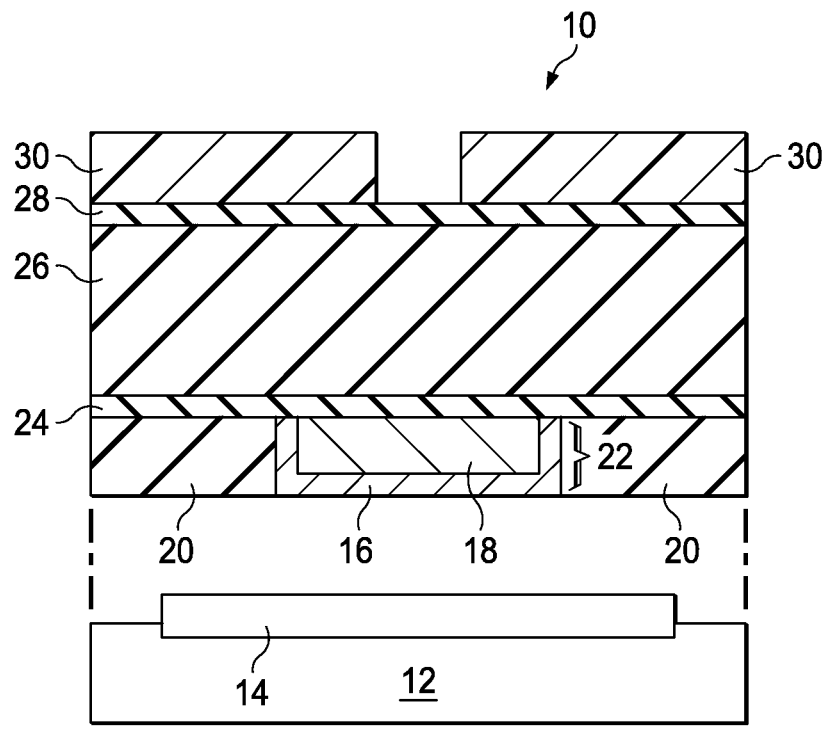
FIGS. 1 through 10 include cross-sectional views and a top view of intermediate stages in the manufacturing of an interconnect structure in accordance with some exemplary embodiments, wherein the interconnect structure includes air gaps.

FIG. 1 illustrates wafer 10, which includes semiconductor substrate 12. In some embodiments, semiconductor substrate 12 is a bulk semiconductor substrate. In alternative embodiments, semiconductor substrate 12 is a Semiconductor-On-Insulator (SOI) substrate. The semiconductor material in semiconductor substrate 12 may comprise silicon, silicon germanium, silicon carbon, a III-V compound semiconductor material, and/or the like. In some embodiments, integrated circuits 14 are formed at a top surface of semiconductor substrate 12. Integrated circuits 14 may include active devices such as transistors.

Over integrated circuit 14 is dielectric layer 20, and conductive line 22 formed in dielectric layer 20. Dielectric layer 20 may be an Inter-Layer Dielectric (ILD) layer or an Inter-Metal Dielectric (IMD) layer, and may have a low dielectric constant (k value) lower than about 2.5, for example. Conductive line 22 may include conductive barrier layer 16 and metal line 18 over barrier layer 16. In some embodiments, barrier layer 16 comprises titanium, titanium nitride, tantalum, tantalum nitride, copper manganese, alloys thereof, and/or multi-layers thereof. Metal line 18 may comprise copper, tungsten, aluminum, nickel, and/or alloys thereof. Conductive line 22 may be electrically coupled to integrated circuits 14, and may serve as the interconnection between the devices in integrated circuits 14.

Etch Stop Layer (ESL) 24 is formed over dielectric layer 20 and conductive line 22. ESL 24 may comprise a nitride, a silicon-carbon based material, a carbon-doped oxide, and/or combinations thereof. The formation methods include Plasma Enhanced Chemical Vapor Deposition (PECVD) or other methods such as High-Density Plasma CVD (HD-PCVD), Atomic Layer CVD (ALCVD), and the like. In alternative embodiments, dielectric layer 24 is a diffusion barrier layer that is used for preventing undesirable elements, such as copper, from diffusing through. In further embodiments, dielectric layer 24 acts as both an etch stop layer and a diffusion barrier layer.

FIG. 1 also illustrates the formation of low-k dielectric layer 26, which provides insulation between conductive line 22 and the overlying conductive lines that will be formed subsequently. Low-k dielectric layer 26 is sometimes referred to as an Inter-Metal Dielectric (IMD) layer. Low-k dielectric layer 26 may have a k value lower than about 3.5, or lower than about 2.5. The materials comprised in low-k dielectric layer 26 may include a carbon-containing material, organosilicate glass, a porogen-containing material, and/or combinations thereof. Low-k dielectric layer 26 may be deposited using PECVD, although other commonly used deposition methods, such as Low Pressure CVD (LPCVD), ALCVD, and spin-on, can also be used.

Hard mask layer 28 is formed over low-k dielectric layer 26. Hard mask layer 28 may be a dielectric layer. In some embodiments, hard mask layer 28 comprises silicon nitride, silicon carbide, titanium nitride, or the like. Photo resist 30 is formed over hard mask layer 28, and is then patterned. It is appreciated that although one photo resist 30 is illustrated, in alternative embodiments, a plurality of layers may be included, which includes, and is not limited to, a bottom layer (such as a carbon-containing material), a middle layer (such as a silicon-containing material, for example), an anti-reflective coating, and/or the like.

Figure 2:
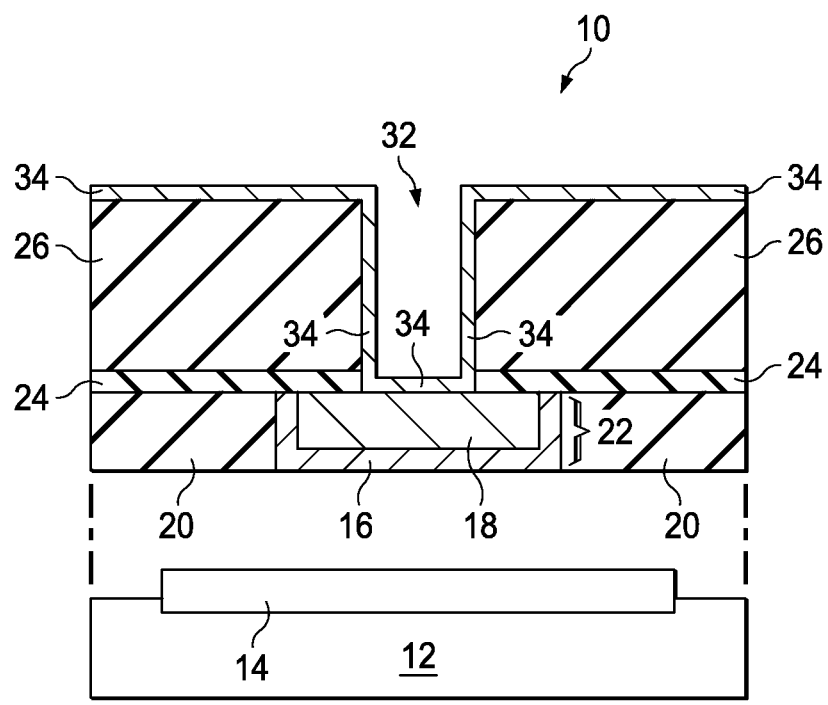

FIG. 2 illustrates the formation of via opening 32 in low-k dielectric layer 26. The formation of via opening 32 includes etching hard mask 28 (FIG. 1), and then etching low-k dielectric layer 26 using the patterned hard mask 28 as an etching mask. ESL 24 is then etched to expose the underlying conductive line 22.

Next, as also shown in FIG. 2, conductive barrier layer 34 is formed. Conductive barrier layer 34 extends into via opening 32, and includes a portion over low-k dielectric layer 26.

Conductive barrier layer 34 also has a bottom portion contacting the top surface of conductive line 22. Barrier layer 34 may prevent the copper in the subsequently formed conductive material 36 (FIG. 3) from diffusing into low-k dielectric layer 26. In some embodiments, conductive barrier layer 34 is formed of a conductive material comprising titanium, titanium nitride, tantalum, tantalum nitride, copper manganese, alloys thereof, or multi-layers thereof.

Figure 3:
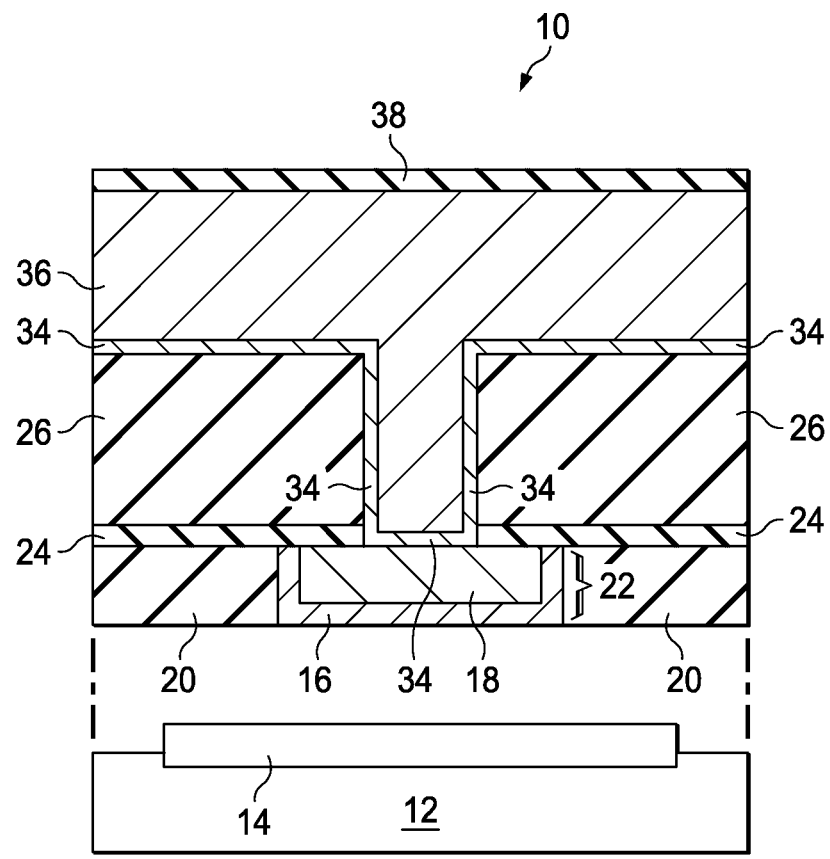

Referring to FIG. 3, conductive material 36 is formed. In some embodiments, conductive material 36 comprises copper, and may be formed of either substantially pure copper or a copper compound. Conductive material 36 is hence accordingly referred to as a copper-comprising material, although conductive material 36 may also be a non-copper material comprising aluminum, tungsten, and/or the like. The top surface of conductive material 36 is higher than the top surface of conductive barrier layer 34. The formation of copper-comprising material 36 may include plating, Metal Organic Chemical Vapor Deposition (MOCVD), or the like. A planarization may be performed to flatten the top surface of copper-comprising material 36. Next, hard mask 38, which may be formed of a material selected from the same group of candidate materials of hard mask 28, is formed over copper-comprising material 36.

Figure 4:
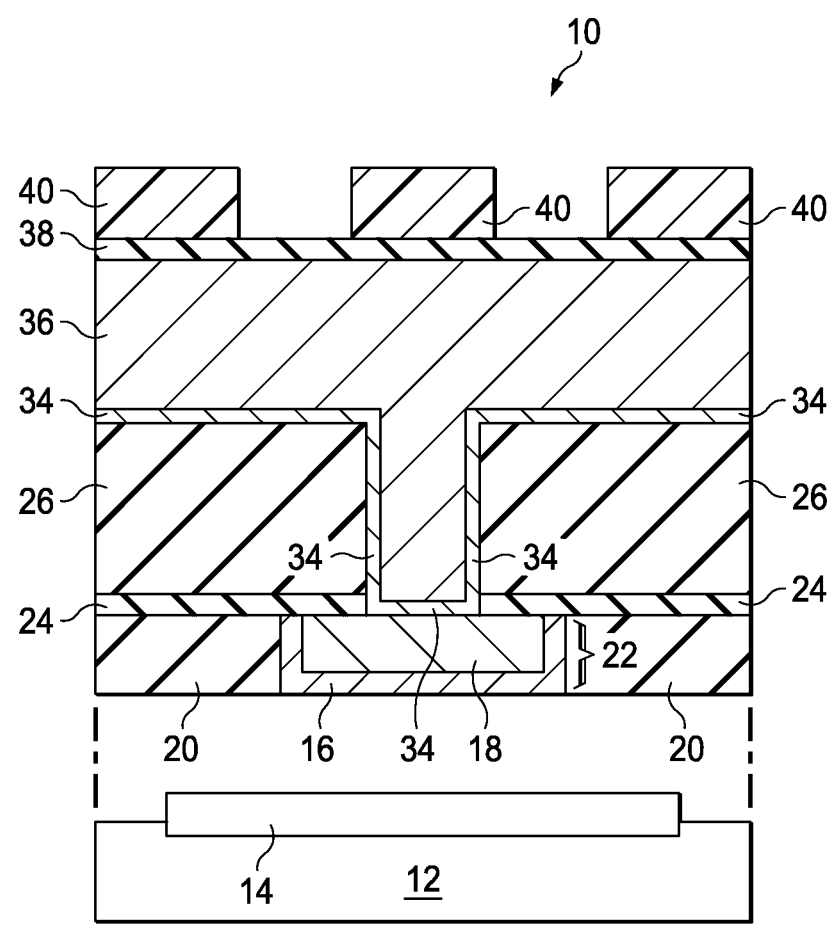
Figure 5:
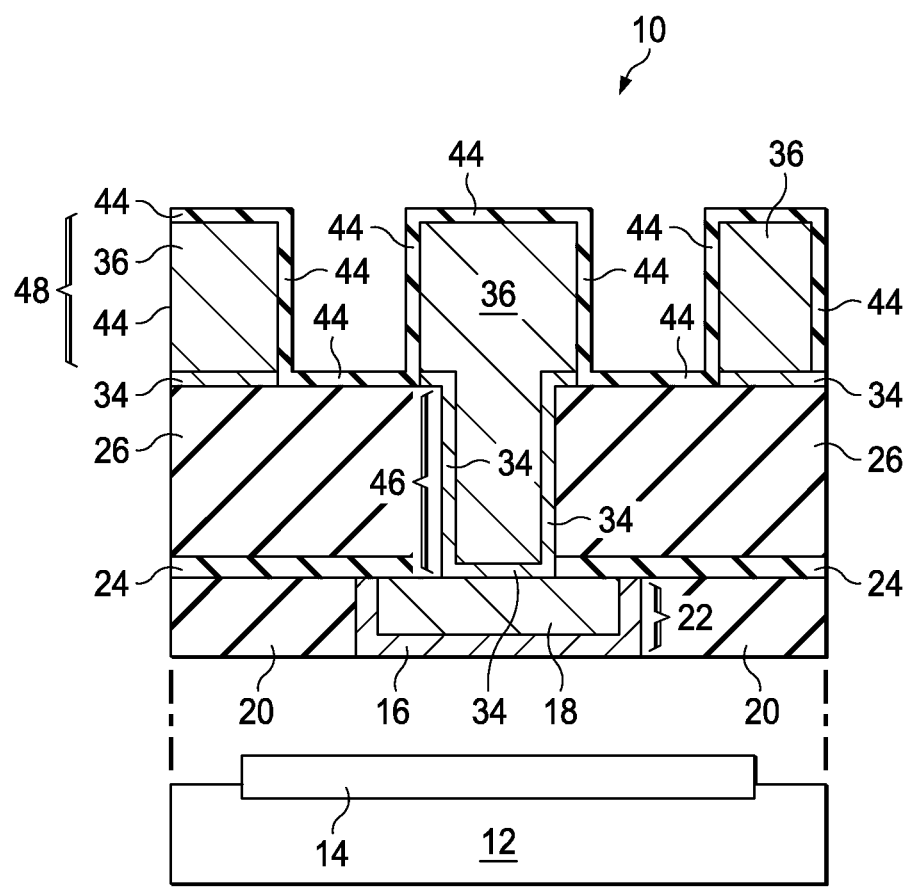

FIG. 4 illustrates the formation and the patterning of photo resist 40. Similar to photo resist 30 in FIG. 1, the illustrated photo resist 40 may represent a plurality of layers including, and not limited to, a bottom layer, a middle layer, an anti-reflective coating, and/or the like. Next, the pattern of photo resist 40 is transferred to the underlying hard mask 38, and then to copper-comprising material 36 and to barrier 34, followed by the removal of photo resist 40 and hard mask 38. The portions of barrier 34 exposed to the openings in photo resist 40 are thus removed. The resulting structure is shown in FIG. 5. The patterning of copper-comprising material 36 may be performed by etching. Dielectric barrier layer 44 is then formed, for example, by deposition. Dielectric barrier layer 44 may be formed of a dielectric material, which may comprise silicon nitride, silicon carbide, silicon oxynitride, carbon nitride, carbon oxide, combinations thereof, and/or multi-layers thereof. After the patterning of copper-comprising material 36, a portion of copper-comprising material 36 in low-k dielectric layer 26 forms via 46 along with the contacting portion of conductive barrier layer 34. The portion of copper-comprising material 36 (that is over low-k dielectric layer 26) and the respective contacting dielectric barrier layer 44 form metal lines 48.

Figure 6:
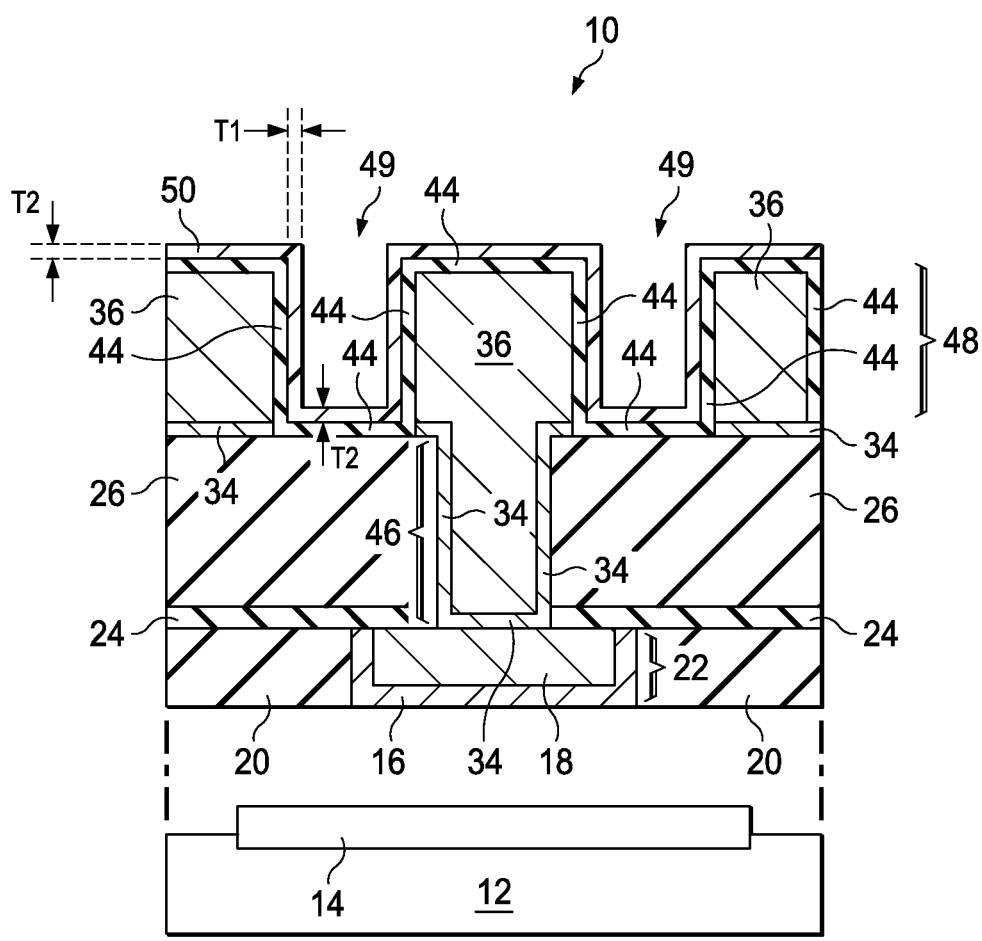

Referring to FIG. 6, decomposable layer 50 is formed over metal lines 48, and in the spaces 49 (also referred to as openings 49) between metal lines 48. In some embodiments, decomposable layer 50 includes a polymer that may decompose and vaporize when exposed to Ultra-Violet light and/or heated to an elevated temperature, for example, between 250° C. and 500° C. Exemplary materials of decomposable layer 50 include P(neopentul methacrylate-co-ethylene glycol dimethacrylate) copolymer, polypropylene glycol (PPG), polybutadine (PB), polyethylene glycol (PEG), polycaprolactone diol (PCL), fluorinated amorphous carbon (a-FiC), silicon gel and/or organic silaxone. Decomposable layer 50 may be formed by spin coating or a deposition process such as a Chemical Vapor Deposition (CVD) process. Alternatively, decomposable layer 50 is formed using Plasma Enhanced Atomic Layer Deposition (PEALD) at a low temperature, for example, between about 30° C. and about 50° C. The PEALD may result in a good conformal profile for decomposable layer 50.

Decomposable layer 50 may be formed as a conformal layer, wherein thickness T1 of the vertical portions of decomposable layer 50 is close to thickness T2 of the horizontal portions of decomposable layer 50. Ratio T1/T2 may also be between about 0.7 and about 1, between about 0.8 and about 1, or between about 0.9 and about 1. Thicknesses T1 and T2 may be between about 5 nm and about 20 nm in some exemplary embodiments. It is appreciated, however, that the values recited throughout the description are merely examples, and may be changed to different values.

Figure 7:
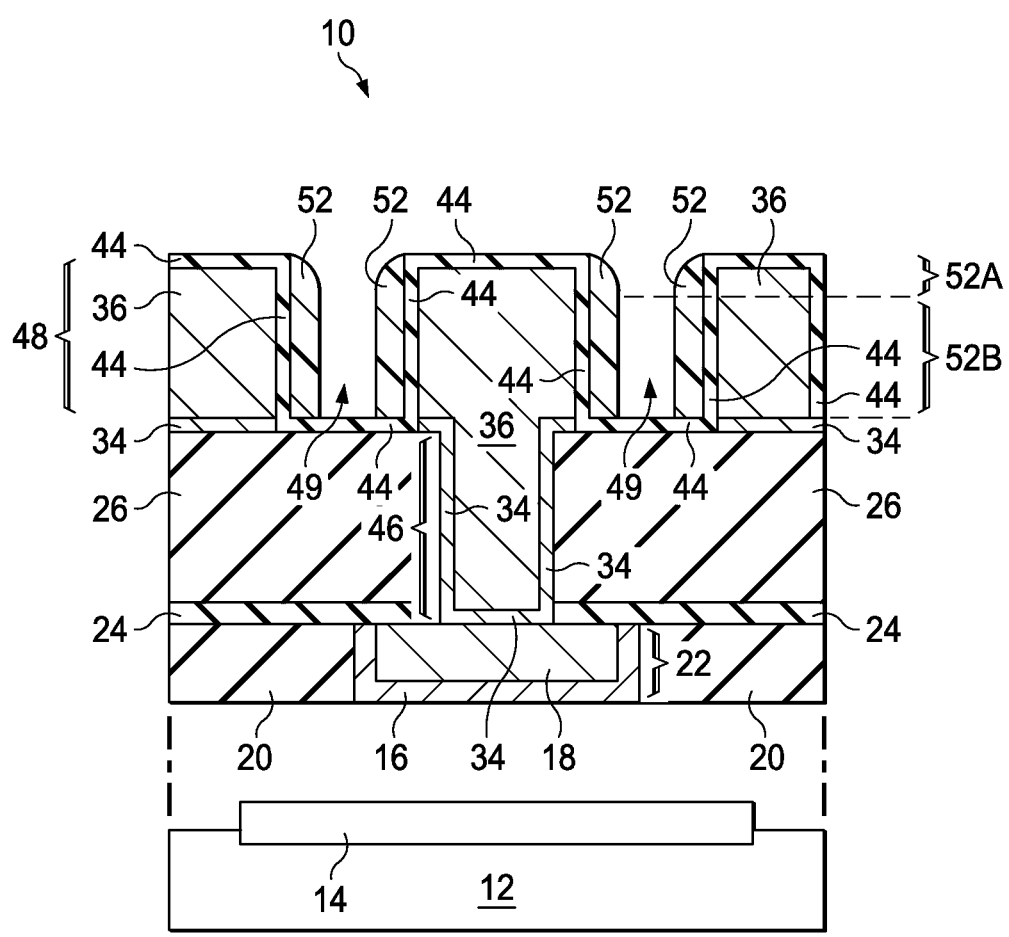

Decomposable layer 50 is then etched. The horizontal portions of decomposable layer 50 are removed, and the vertical portions of decomposable layer 50 on the sidewalls of metal lines 48 are left, forming decomposable spacers 52, as shown in FIG. 7. The etching may be an anisotropic etching, and may be a dry etching, for example. As a result of the anisotropic etching, the upper portions 52A of decomposable spacers 52 may have a tapered profile, with lower thicknesses of decomposable spacers 52 greater than upper widths. Decomposable spacers 52 may also have lower portions 52B that have substantially vertical sidewalls.

Figure 8:
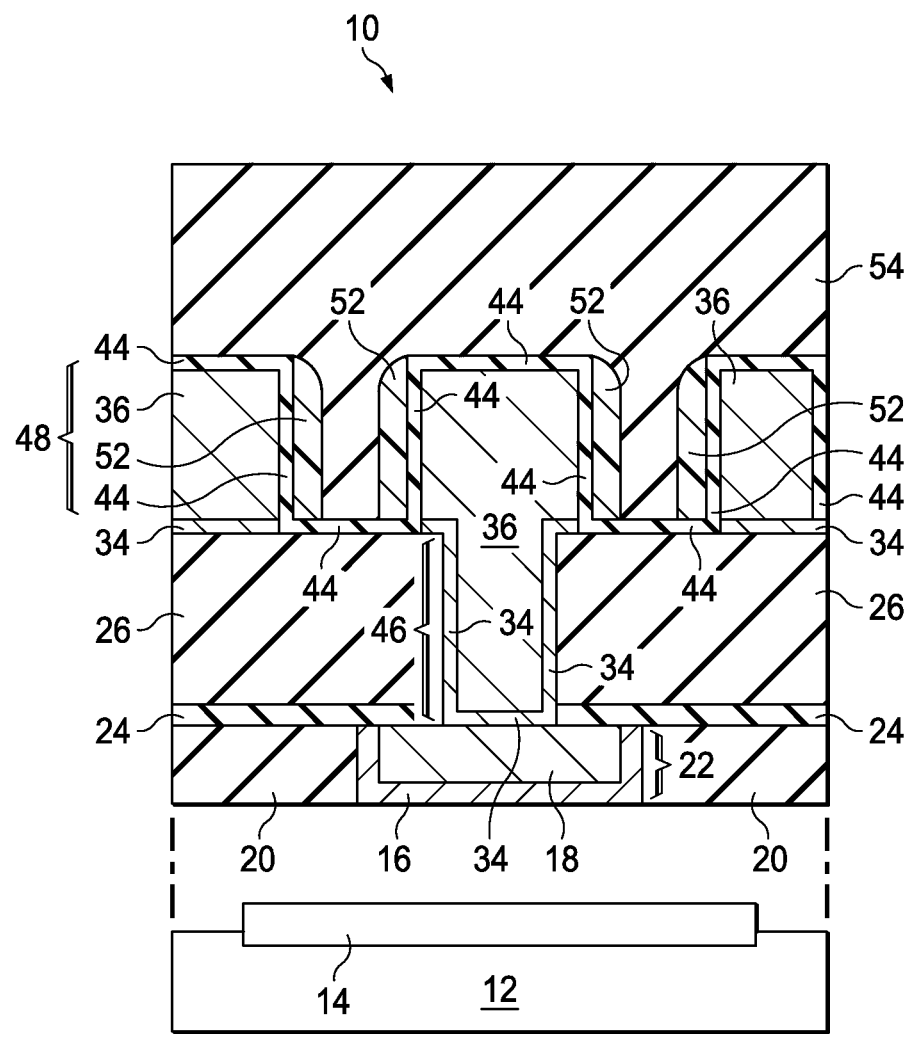

Next, in FIG. 8, low-k dielectric material 54 is formed. Low-k dielectric material 54 may have a k value lower than about 3.0, or lower than about 2.5, and may be formed of carbon-containing low-k dielectric materials, for example. Low-k dielectric material 54 is porous. Openings 49 (FIG. 7) between metal lines 48 are filled with lower portions of low-k dielectric material 54. Furthermore, low-k dielectric material 54 may include an upper portion over and contacting dielectric barrier layer 44, which are top surface portions of metal lines 48. The lower portions and the upper portions of low-k dielectric material 54 are formed in a same formation process, and hence there is no visible interface therebetween. Low-k dielectric material 54 may be formed using spin-on coating to take the advantage of its good gap filling capability, so that trenches 49 are filled with substantially no void therein, and the upper portion of low-k dielectric material 54 may have a substantially planar top surface.

Figure 9A:
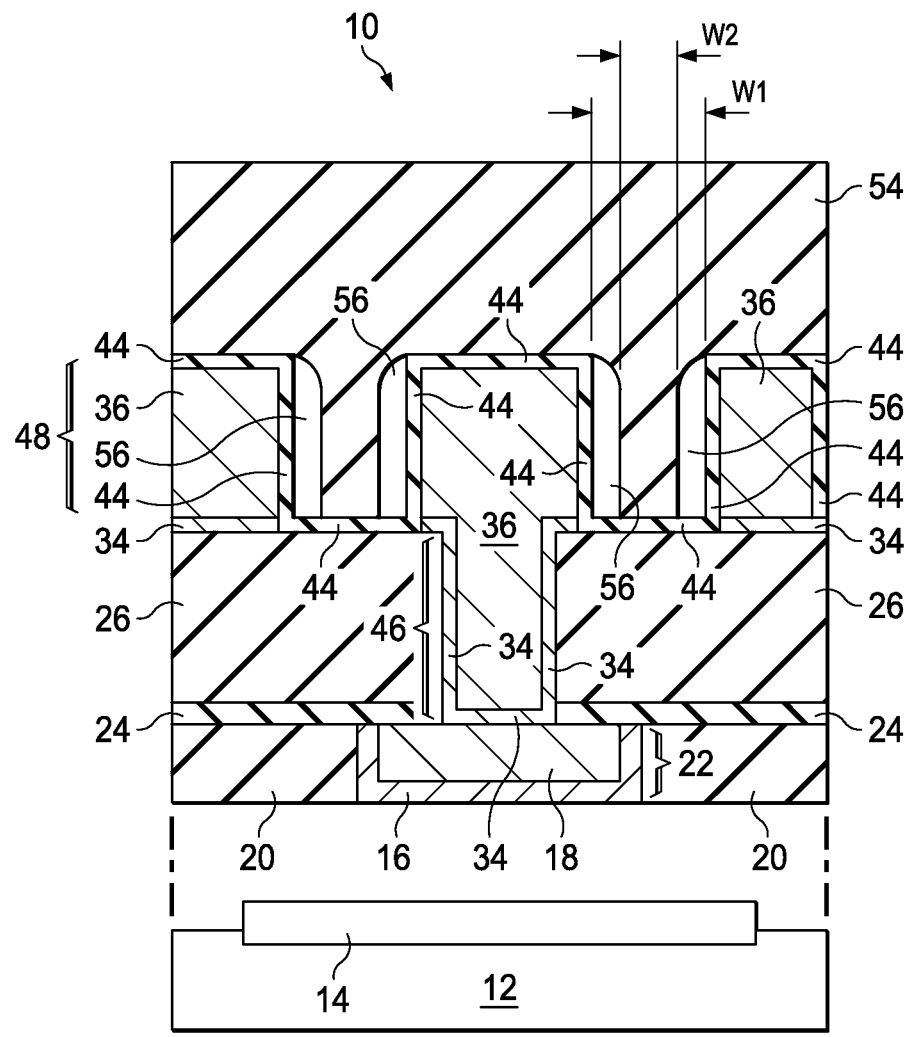

As shown in FIG. 9A, decomposable spacers 52 are decomposed and turned into a vapor with molecules small enough to diffuse through the pores of low-k dielectric material 54. Air-gaps 56 are thus formed. The decomposition and vaporization may be performed through an UV exposure and/or a heating process at an elevated temperature. In some exemplary embodiments, decomposable spacers 52 include decomposable layer 50 that includes P(neopentul methacrylate-co-ethylene glycol dimethacrylate) copolymer. The vaporization may thus be performed with a UV exposure, and the corresponding heating temperature may be between about 250° C. and about 500° C.

As a result of the vaporization, air gaps 56 are formed. Air gaps 56 may have essentially the same profile as that of decomposable spacers 52 in FIG. 8, for example, having the tapered upper portions, and lower portions having substantially vertical sidewalls. Low-k dielectric material 54 comprises edges exposed to air gaps 56. Furthermore, some vertical portions of conductive barrier layer 34 may be exposed to air gaps 56. The top ends of air gaps 56 may be substantially level with, or lower than, the top surfaces of metal lines 48. Low-k dielectric material 54 includes a lower portion between metal lines 48, and an upper portion over the lower portion of low-k dielectric material 54 and metal lines 48. At the level lower than and close to the level of the top surfaces of metal lines 48, the lower portion of low-k dielectric material 54 may have a tapered profile, and have lower widths W2 increasingly greater than the respective upper widths W1.

Figure 9B:
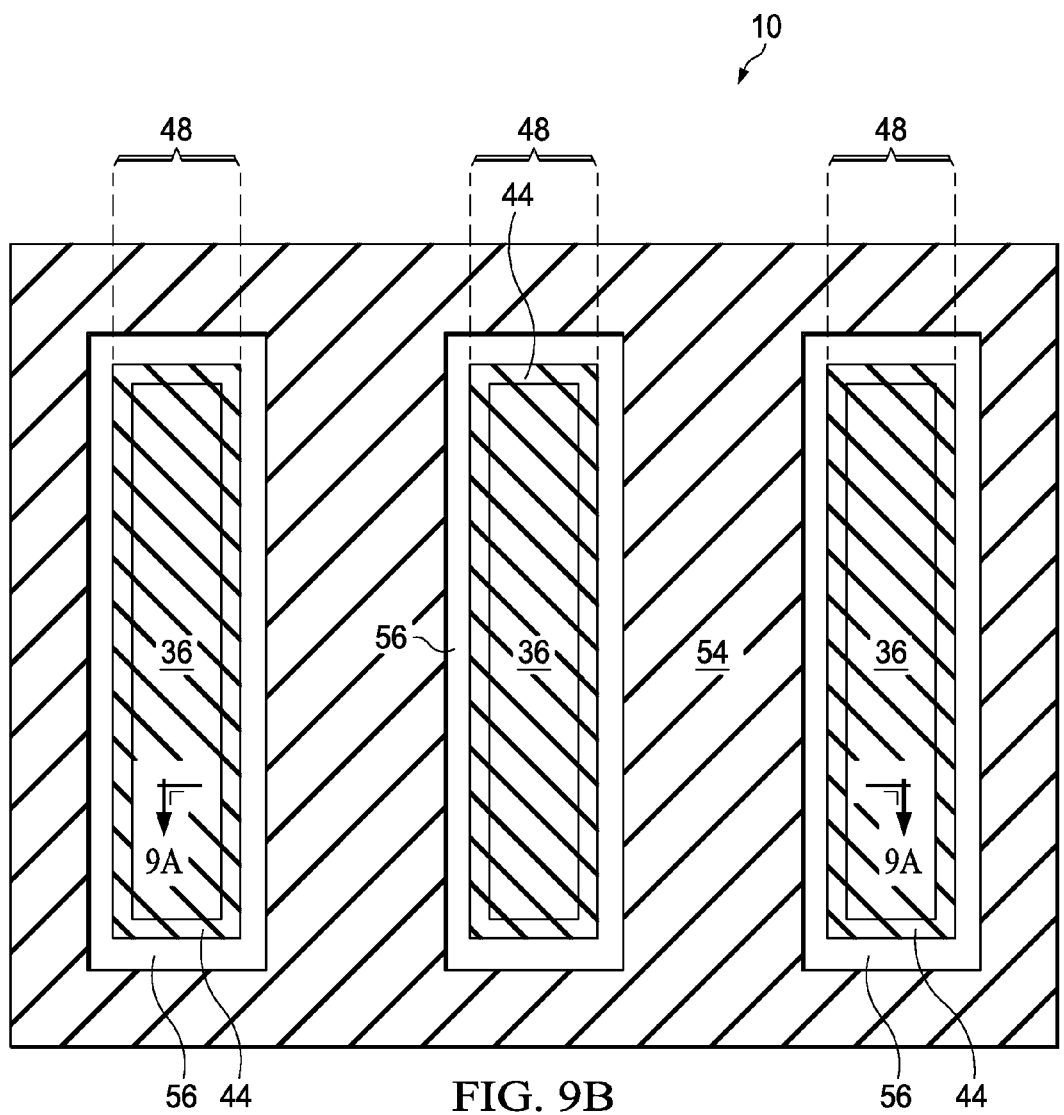

FIG. 9B illustrates a top view of the structure in FIG. 9A. It is shown that each of air gaps 56 may form a continuous air gap ring encircling one of metal lines 48. In the top-view, low-k dielectric material 54 further encircles air gap rings 56.

Figure 10:
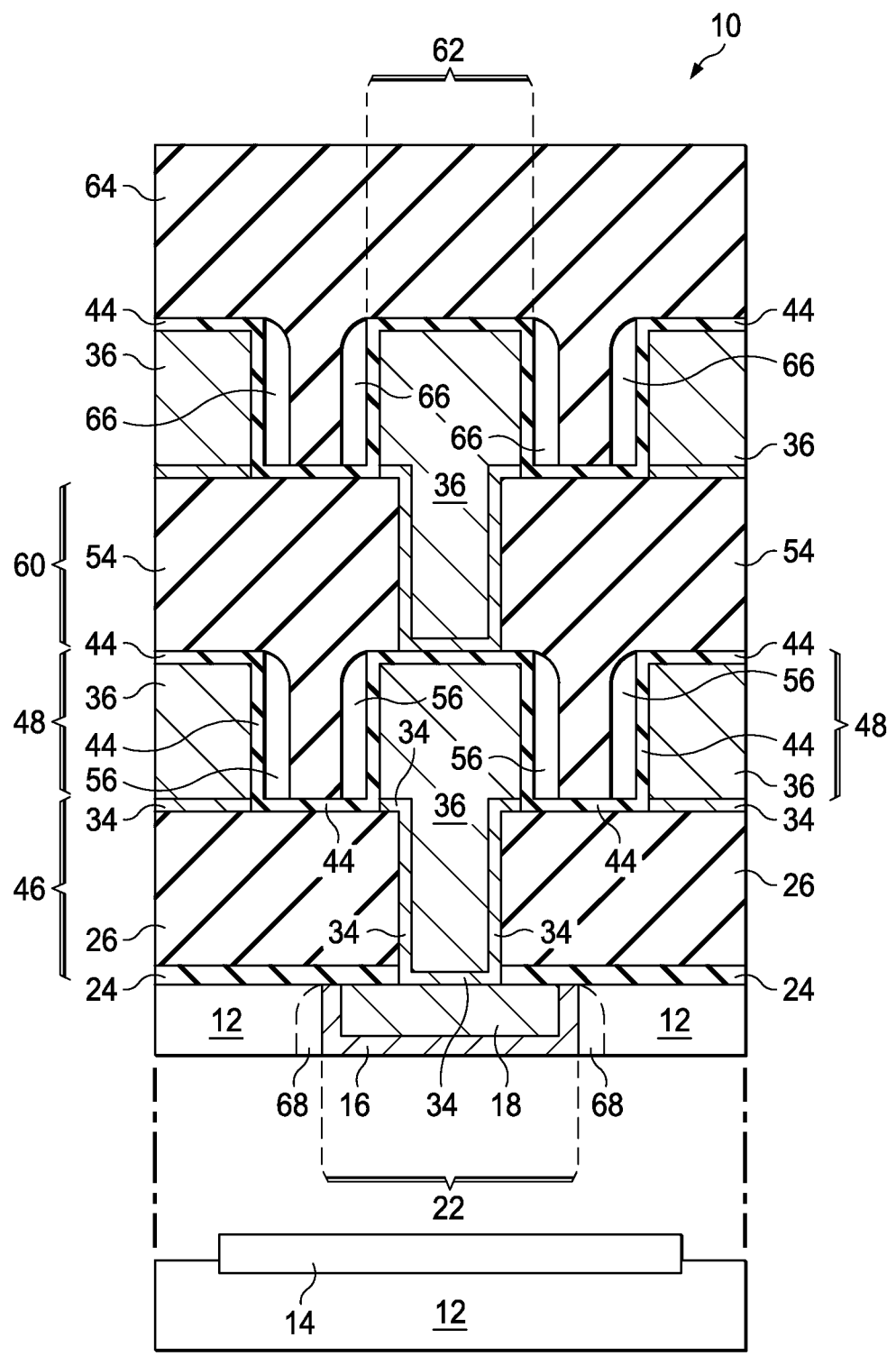

FIG. 10 illustrates additional via 60 over metal lines 48 and in low-k dielectric material 54, and metal lines 62 over via 60 in low-k dielectric material 64. Via 60 is electrically coupled to the respective underlying metal line 48. Air gaps 66 may be formed on the sidewalls of, and encircle, metal lines 62. The formation processes may be essentially the same as in FIGS. 2 through 9A, and are not repeated herein.

In the previously discussed embodiments, the metal lines and the underlying vias are formed simultaneously. Similar process and materials as discussed in the embodiments can also be adopted in the formation of metal lines with no underlying vias. For example, as shown in FIG. 10, air gaps 68 may also be formed to encircle conductive line 22. The formation process may be realized through the teaching of the embodiments.

In the embodiments, air gaps are formed in the interconnect structures. Since air gaps have a k value equal to 1, the equivalent k value of the dielectric material in the interconnect structures is lowered, resulting in a reduction in the parasitic capacitance between metal lines 48 (FIG. 10). The formation of the air gaps is uniform and controllable, and does not suffer from the permeable (porous) hard mask collapsing problem that may occur in conventional methods for forming the air gaps.

In accordance with embodiments, a structure includes a substrate, and a first metal line and a second metal line over the substrate, with a space therebetween. A first air gap is on a sidewall of the first metal line and in the space, wherein an edge of the first metal line is exposed to the first air gap. A second air gap is on a sidewall of the second metal line and in the space, wherein an edge of the second metal line is exposed to the second air gap. A dielectric material is disposed in the space and between the first and the second air gaps.

In accordance with other embodiments, a structure includes a substrate, and a metal line over the substrate. The metal line includes a copper-containing line, and a dielectric barrier layer having a top portion over and contacting the first metal line, and an edge portion contacting a sidewall of the first metal line. An air gap encircles the metal line, wherein the edge portion of the dielectric barrier layer is exposed to the air gap. A low-k dielectric region has a sidewall exposed to the first air gap.

In accordance with yet other embodiments, a method includes forming a conductive region, etching the conductive region to form an opening in the conductive region, and forming a decomposable layer. The decomposable layer includes a top portion over the conductive region, a sidewall portion on a sidewall of the conductive region, and a bottom portion at a bottom of the opening. The decomposable layer is etched to remove the top portion and the bottom portion of the decomposable layer. A low-k dielectric layer is formed in a remaining portion of the opening. The sidewall portion of the decomposable layer is decomposed to form an air gap.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

The invention claimed is:

1. A method comprising:
   forming a conductive region;
   etching the conductive region to form an opening in the conductive region;
   forming a decomposable layer comprising a top portion over the conductive region, a sidewall portion on a sidewall of the conductive region, and a bottom portion at a bottom of the opening;
   etching the decomposable layer to remove the top portion and the bottom portion of the decomposable layer, wherein a remaining portion of the decomposable layer forms a decomposable spacer on the sidewall of the conductive region;
   forming a low-k dielectric layer in a remaining portion of the opening; and
   decomposing the decomposable spacer to form an air gap.

2. The method of claim 1, wherein the decomposable spacer has a tapered profile, with lower widths of an upper portion of the decomposable spacer increasingly greater than upper widths of the upper portion of the decomposable spacer.

3. The method of claim 1, wherein at a time the decomposing is performed, the low-k dielectric layer comprises a top surface higher than a top end of the sidewall portion of the decomposable layer, and wherein the sidewall portion of the decomposable layer is evaporated through the low-k dielectric layer.

4. The method of claim 1, wherein the etching the conductive region comprises etching a copper-containing region, and wherein the method further comprises, after the etching the copper-containing region, etching a conductive barrier underlying the copper-containing region.

5. The method of claim 4, wherein the forming the conductive region comprises, after the etching the copper-containing region, forming a dielectric barrier layer on a sidewall and a top surface of a remaining portion of the copper-containing region.

6. The method of claim 1, wherein the forming the conductive region comprises:
   etching an additional dielectric layer to form an opening; and
   filling the opening with a conductive material, wherein a top surface of the conductive material is higher than a top surface of the additional dielectric layer, and wherein a portion of the conductive material forms the conductive region.

7. The method of claim 1, wherein the decomposing the decomposable spacer comprises an ultra-violet light-exposure at an elevated temperature.

8. A method comprising:
   etching a first dielectric layer to form a via opening;
   forming a conductive barrier layer comprising a first portion over the first dielectric layer, and a second portion in the via opening;

filling the via opening with a conductive material to form a via in the via opening, wherein the conductive material comprises a portion overlapping the first portion of the conductive barrier layer;

patterning the conductive material, wherein remaining portions of the conductive material form a first metal line and a second metal line spaced apart from each other, with the second metal line overlapping and joined to the via;

forming a dielectric barrier layer on top surfaces and sidewalls of the first metal line and the second metal line;

forming decomposable spacers on the sidewalls of the first metal line and the second metal line, wherein the forming the decomposable spacers comprises:

forming a decomposable layer comprising top portions over the first metal line and the second metal line, sidewall portions on the sidewalls of the first metal line and the second metal line, and a bottom portion at a bottom of a space between the first metal line and the second metal line; and etching the decomposable layer to remove the top portions and the bottom portion of the decomposable layer, wherein the sidewall portions of the decomposable layer form the decomposable spacers;

forming a second dielectric layer filling a space between the first metal line and the second metal line; and decomposing the decomposable spacers to form an air gap.

9. The method of claim 8, wherein the air gap has a tapered profile, with lower widths of an upper portion of the air gap increasingly greater than upper widths of the upper portion of the air gap.

10. The method of claim 8, wherein after the etching the decomposable layer, a portion of the dielectric barrier layer remains at a bottom of the space.

11. The method of claim 8, wherein the etching the decomposable layer stops on the dielectric barrier layer.

12. The method of claim 8, wherein when the decomposing the decomposable spacer is performed, the second dielectric layer comprises portions overlapping the first metal line and the second metal line.

13. The method of claim 8, wherein the decomposing the decomposable spacers comprises an ultra-violet light exposure at an elevated temperature.

14. The method of claim 8, wherein the air gap encircles one of the first metal line and the second metal line.

15. The method of claim 8, wherein the air gap is in contact with the dielectric barrier layer and the second dielectric layer.

16. A method comprising:

forming a first metal line and a second metal line:

forming a dielectric barrier layer on top surfaces and sidewalls of the first metal line and the second metal line;

forming a decomposable layer over the dielectric barrier layer;

etching the decomposable layer to form a first and a second decomposable spacer encircling the first metal line and the second metal line, respectively, with the first and the second decomposable spacers separated from each other by a space;

forming a dielectric layer comprising a portion filling the space; and decomposing the first and second decomposable spacers to form an air gap.

17. The method of claim 16, wherein the etching the decomposable layer stops on the dielectric barrier layer.

18. The method of claim 16, wherein after the etching the decomposable layer, a portion of the dielectric barrier layer at a bottom of the space remains, and the dielectric layer contacts a top surface of the portion of the dielectric barrier layer.

19. The method of claim 16, wherein the portion of the dielectric layer comprises a sidewall contacting the first decomposable spacer, and the sidewall of the portion of the dielectric layer is more curved than a sidewall of the dielectric barrier layer contacting a sidewall of the first metal line.

* * * * *